(12) United States Patent
Pogosky et al.

(10) Patent No.: US 8,359,504 B1
(45) Date of Patent: Jan. 22, 2013

(54) DIGITAL FUNCTIONAL TEST SYSTEM

(75) Inventors: Marc Pogosky, North Babylon, NY (US); Richard Engel, Ridge, NY (US); Eli Levi, Dix Hills, NY (US)

(73) Assignee: Advanced Testing Technologies, Inc., Hauppauge, NY (US)

( * ) Notice: Subject to any disclaimer, the term of this patent is extended or adjusted under 35 U.S.C. 154(b) by 386 days.

(21) Appl. No.: 12/781,888

(22) Filed: May 18, 2010

(51) Int. Cl.
*G01R 31/28* (2006.01)
(52) U.S. Cl. ...................................... 714/731
(58) Field of Classification Search .................. None
See application file for complete search history.

(56) References Cited

U.S. PATENT DOCUMENTS

| | | | |
|---|---|---|---|
| 4,692,886 A | 9/1987 | Miki et al. | |
| 5,664,092 A * | 9/1997 | Waites | 714/25 |
| 5,805,619 A * | 9/1998 | Gardner et al. | 714/814 |
| 5,905,967 A | 5/1999 | Botham | |
| 6,351,786 B2 * | 2/2002 | Elmore et al. | 710/303 |

OTHER PUBLICATIONS

La Cascia, D.;, "VXI ATE technology," AUTOTESTCON '90. IEEE Systems Readiness Technology Conference. 'Advancing Mission Accomplishment', Conference Record., vol., no., pp. 137-144, Sep. 17-21, 1990.*
Emmert, G.T.;, "Considerations for implementing high performance VXI test systems," AUTOTESTCON '98. IEEE Systems Readiness Technology Conference., 1998 IEEE, vol., no., pp. 466-473, Aug. 24-27, 1998.*
HP 75000 Model D20 Digital Functional Test System, Product Note, date unknown.

* cited by examiner

*Primary Examiner* — Ajay Bhatia
*Assistant Examiner* — Daniel McMahon
(74) *Attorney, Agent, or Firm* — Brian Roffe (57) ABSTRACT

A digital functional test system incorporating both digital stimulus and digital response/compare capability for digital electronic circuitry. The system includes a chassis and a single width VME eXtensions for Instrumentation (VXI) module arranged in or on the chassis. The single width VXI module includes a timing sub-module that generates a stimulus clock signal and a response clock signal, eight pattern sub-modules, and a master oscillator sub-module that provides a clock signal. Each pattern sub-module receives the stimulus and response clock signals, and the clock signal from the master oscillator sub-module, and includes a pattern generating module, a stimulus memory component that stores stimulus data outgoing from the pattern generating module, a response memory component that records response data incoming to the pattern generating module, and a compare reference memory component that provides a reference for a compare function of the recorded response data in the response memory component.

27 Claims, 7 Drawing Sheets

DIGITAL FUNCTIONAL TEST SYSTEM

FIELD OF THE INVENTION

The present invention relates generally to the field of automatic test systems for testing digital electronic circuits and sub-assemblies and more particularly, to automatic test equipment for providing digital stimulus and evaluating digital response/compare signals within a scalable high speed environment.

BACKGROUND OF THE INVENTION

In the field of testing digital electronic circuits, the HP/Agilent Technology Model D20 Digital Functional Test System has been used for some time, and is described more fully in a Product Note dated Aug. 1, 1991.

As to U.S. patents, U.S. Pat. No. 4,692,886 (Miki et al.) describes a digital pattern generator that generates various kinds of digital pattern signals. The generator includes a first memory that stores an execution signal, an area control signal and a digital pattern, a program counter that generates a first address signal in accordance with the execution signal read from the first memory and a first clock signal, and the first memory is addressed by the first address signal. A second memory includes a plurality of memory areas each storing a digital pattern, and a capacity of each the memory area corresponds to that of the first memory. When the memory area of the second memory is selected by the area control signal read from the first memory and the selected memory area is addressed by the first address signal, the second memory acts as an auxiliary memory of the first memory.

U.S. Pat. No. 5,905,967 (Botham) describes automatic test equipment with programmable timing generators that generate digital signals and analog signals. The digital timing generator can be programmed to generate timing signals with a resolution finer than that of the master clock of the timing generator. Extremely fine resolution is achieved by specifying the numerator and denominator of a fractional portion of a period. A similar arrangement is used to allow fine frequency resolution for the analog timing generator. The fine resolution achievable with the timing generators allows the digital timing generator to be synchronized to the analog timing generator.

In view of the relatively long time since the original application of the HP/Agilent D20 in or about 1991, it would be desirable to provide a replacement for this digital functional test system that is current vis-à-vis technological advances since 1991.

SUMMARY OF THE INVENTION

A digital functional test system in accordance with the invention, that can serve as a replacement for the HP/Agilent D20, includes a chassis and one or more single width VXI modules arranged in the chassis. Each single width module includes a timing sub-module that generates a stimulus clock signal and a response clock signal, at least eight pattern sub-modules, each including eight bi-directional input/output pins, and a master oscillator sub-module that provides a clock signal. Each pattern sub-module receives the stimulus clock signal and the response clock signal from the timing sub-module, and the clock signal from the master oscillator sub-module. Further, each pattern sub-module includes a pattern generating module, a stimulus memory component that stores stimulus data outgoing from the pattern generating module, a response memory component that records response data incoming to the pattern generating module, and a compare reference memory component that provides a reference for a compare function of the recorded response data in the response memory component. The stimulus memory component, response memory component and compare reference memory component receive the clock signal from the master oscillator sub-module, possibly independently of one another. Each pattern sub-module may include digital elements within a field programmable gate array.

The stimulus memory component, response memory component and compare reference memory component may each comprise a bank of random access memory. Moreover, these memory components may be arranged to enable simultaneous reading of data therefrom or writing of data thereto.

The digital functional test system may include modules in or on the chassis other than the single width modules described above. At a minimum, the digital functional test system includes one such single width module as described above. Furthermore, in one embodiment, each single width module includes a VME eXtensions for Instrumentation-Ember Trace (VXI-ET) interface that converts Multisystem Extension Interface (MXI) data into Ember-Trace (ET) bus architecture that is processed by the timing sub-module and the pattern sub-modules of the single width module.

Another digital functional test system in accordance with the invention includes a plurality of single width VME eXtensions for Instrumentation (VXI) modules arranged in or on a chassis, each including at least a timing sub-module and eight pattern sub-modules with eight bi-directional input/output pins and optionally with the additional components described above, a plurality of interfaces interacting with the single width modules including a high speed interface, and a bridge card connected to the single width modules via the high speed interface. The bridge card, which may also be provided in the embodiment described above, receives a timing signal from a first single width module and distributes a clock signal to a plurality of single width modules including that first single width module to thereby enable the plurality of single width modules to operate synchronously. Further, the bridge card preferably employs a clock skew technique to ensure that signals to all of the plurality of single width modules arrive before a rising edge of the clock signal.

The bridge card can be configured to provide a substantially equal length of a trace conductor from a clock distribution circuit on the bridge card to a plurality of outlets of the bridge card, each outlet being connected to a clock-in port of a respective one of the single width modules.

Yet another embodiment of a digital functional test system in accordance with the invention includes a chassis, one or more single width VXI modules arranged in or on the chassis and which may be any of those described above, a plurality of interfaces interacting with the single width module(s), and a VXI-ET interface that converts MXI data into ET bus architecture that is processed by the timing sub-module and the pattern sub-modules. In this embodiment, a specific timing sub-module is used and generates timing signals. To this end, the timing sub-module includes a timing generator coupled to the VXI-ET interface, a sequence controller coupled to the VXI-ET interface and that receives timing signals from the timing generator, a timing cycle address counter, timing cycle RAM coupled to the VXI-ET interface and to the timing cycle address counter and which stores timing signals to be output from the single width module, and a First-In, First-Out (FIFO) queue interposed in a signal path between the sequence controller and the timing cycle address counter. The FIFO queue operates as an elastic buffer for data from the sequence controller to the timing cycle address counter to insure sequence data neither overflows nor underflows. This timing sub-module may also be used in the embodiments described above.

Further, during a non-limiting, exemplifying operation of the digital functional test system, the sequence controller provides timing data to the FIFO queue until a control flag indicating the FIFO queue is nearing capacity is asserted and then loading of data into the FIFO queue ceases and data from the FIFO queue is gradually processed by the timing cycle address counter. When data in the FIFO queue is exhausted, a control flag indicating that the FIFO queue is nearing an empty state is asserted and the process repeats. The sequence controller loads and manages timing tags that feed the timing generator. The sequence controller may also be arranged to sequence data and timing cycle tags that feed the FIFO queue.

A marker logic component may be provided in the digital functional test system and sourced by the FIFO queue, i.e., the timing cycle tag data fed into the FIFO queue sources marker outputs via the marker logic component.

BRIEF DESCRIPTION OF THE DRAWINGS

The following drawings are illustrative of embodiments of the invention and are not meant to limit the scope of the invention as encompassed by the claims.

DETAILED DESCRIPTION OF PREFERRED EMBODIMENTS

Figure 1:
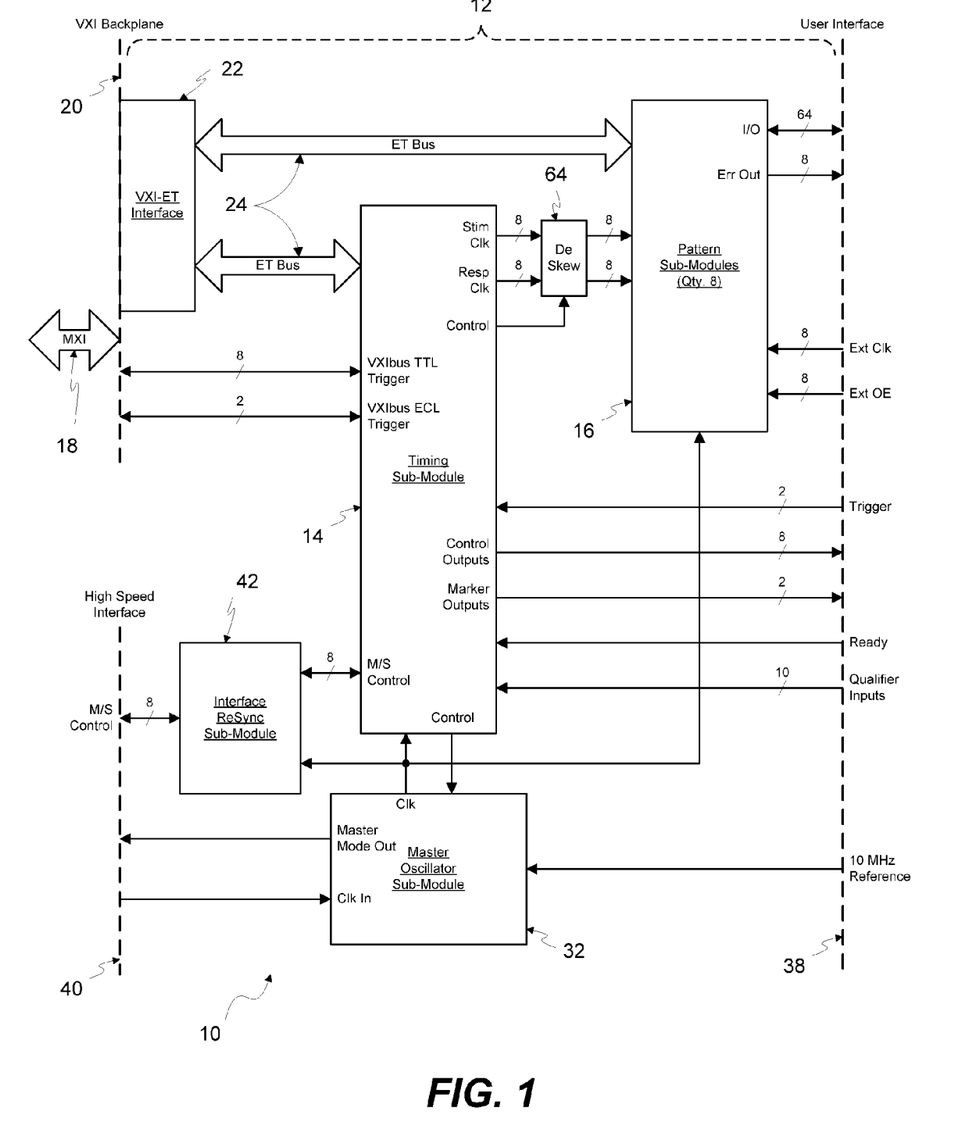
FIG. 1 reflects a simplified overall block diagram of a digital functional test system in accordance with the invention and how it interfaces with sub-modules and a device under test (DUT) via a user interface.

Referring to the accompanying drawing wherein like reference numerals refer to the same or similar elements, a digital functional test system in accordance with the invention is designated generally as 10 and includes at least one single slot or single width VXI module 12, all of which may have substantially the same components. Each single width VXI module 12 comprises a timing sub-module 14, and a minimum of eight (8) pattern sub-modules 16. Each pattern sub-module 16 consists of eight (8) bi-directional I/O pins, for a total of 64 bi-directional I/O pins. The test system 10 can be configured to operate each VXI module 12 as an independent entity, as a synchronized system having a single master module and a plurality of slave modules or a combination thereof.

The pattern sub-module 16 is represented as a block in FIG. 1 but it must be understood that this is primarily for the sake of presenting meaningful drawings in this application. In actuality, the pattern sub-module block in FIG. 1, as well as the other sub-module and module blocks in FIG. 1 and the remaining figures, are not tangible items but rather may be digital elements within a field programmable gate array (FPGA) that are grouped together for ease of managing the design. For instance, rather than duplicating a group of digital logic multiple times, the group can be assigned a name and represented by a block. That block is then duplicated and represented throughout the overall design of the invention shown in the drawings. This provides at least two distinct advantages: 1) a multi-page digital design can be reduced to a single block, wherein the block may consist of smaller blocks, and thereby allow an unwieldy design to be handled more easily; and 2) a block that is re-used exists as a single entity. If a digital layout were duplicated 'x' times, any change within that circuit would need to be changed in 'x' places. If it is managed as a single entity, it is changed in one place and thus automatically changed in all instances where that same entity is used. Sometimes a block may or may not incorporate elements that make logical sense, and blocks may be placed for convenience at times which sometimes conflicts with what would be implemented with discrete components.

The pattern sub-module 16 is one such area affected by the aforementioned logic, i.e., a particular group of digital gates/logic is re-used eight times. A VXI-ET interface 22 is used by each FPGA so therefore this block is re-used as well. An exemplifying physical implementation uses a plurality of FPGAs, e.g., five, wherein four FPGAs are identical and contain two pattern sub-modules 16 and the VXI-ET interface 22.

The digital functional test system 10 is intended to be scalable so that the size of the system 10 can vary as desired, e.g., expand as test requirements change. A typical VXI chassis can accommodate 13 VXI modules or 12 VXI modules along with a system controller. In this configuration, the digital functional test system 10 would be scalable from 1 to 12 single width VXI modules 12. The system 10 could be further expanded to cover a plurality of chassis for even more I/O, although potentially at reduced operating speed.

Each single width VXI module 12 preferably contains circuitry for implementing and operating a minimum of eight (8) Input/Output (I/O) ports, each consisting of eight (8) bits each for a total of 64 pins of bi-directional I/O (see I/O 64 at the upper right of the pattern sub-module 16). Each VXI module 12 could be operated independently, slaved with one or more other VXI modules to a designated master module or mixture thereof. This flexibility allows a single VXI module to coordinate operation across a large number of I/O pins, or a plurality of VXI modules coordinating different digital functions concurrently.

The digital functional test system 10 is comprised of at least five main software programmable components: sequences, pin groups, patterns, timing cycles and sub-cycles. A user would typically program the operation of the digital functional test system 10 through a series of software commands that set-up each of these programmable software components. The manipulation of these software components by the hardware of the digital functional test system 10 is described more fully below.

A sequence is the uppermost programmable level of the digital functional test system 10. A sequence is typically comprised of a minimum of four (4) and a maximum of 1 Meg (1,048,576) discrete events or steps which are executed sequentially. These "events" are referred to as vectors. A vector is an entity that combines the pattern data being sent or received by a pin group with the timing cycle data associated with it. Vectors have other attributes assigned to them as well. These attributes are: trigger arm, Loop branch, marker and end of sequence. If a vector is "armed", the sequence stops at that vector and waits for a trigger. If a particular vector is assigned to branch, the sequence loops back to a designated vector. If a marker is assigned to a vector, a pulse is generated on an ancillary line out to the user. A vector is also designated as the last one in the sequence. A sequence can be executed once, exercised through a fixed number of iterations and/or looped indefinitely. Multiple sequences can be stored in memory provided the total number of vectors does not exceed sequence memory.

A pin group is a static entity which provides the physical interface to a DUT. Pin groups are composed of a single eight (8) bit bi-directional port (the pattern sub-module 16) or a plurality of eight (8) bit ports. When using a Standard Commands for Programmable Instruments (SCPI) message-based interface, a pin group can be assigned a pneumonic label as part of the sequence construction. Pin groups can be designated as stimulus (data sourced to the DUT), response (data received from the DUT) or half duplex stimulus and response. Response data is both recorded and compared to user-stored reference data. When a mismatch between the response and reference data occurs, a flag is stored in memory along with the recorded erroneous data. A dynamic masking feature is provided that allows the user to blank any or all bits of any pattern on the pins of a group on a vector-to-vector basis to prevent the comparison of known invalid data. One meg deep independent memories for each function (stimulus, response, compare) permit complex test sequences to be assembled.

A pattern is the value on a pin group either being sent to or received from the DUT (device under test) for the duration of a vector. Data can be represented in binary, octal, decimal or hexadecimal format.

A timing cycle is the length of time a vector is executed (patterns present/valid on the respective pin groups) and can change from vector to vector. Each timing cycle is divided into smaller, equal periods of time called sub-cycles. A sub-cycle represents the smallest timing resolution used within a sequence and is fixed across all timing cycles used with a sequence.

Moreover, a timing cycle contains all timing information that occurs within the execution of a vector. An eight (8) bit output port can be programmed to provide a sub-sequence of patterns at the sub-cycle rate for any given timing cycle. The information within a timing cycle includes, for example: which sub-cycle to clock stimulus pattern data out to the DUT, which sub-cycle to clock response pattern data in from the DUT, which sub-cycle(s) to stop and wait for a 10 bit condition qualifier to be evaluated and finally which sub-cycle to prematurely end the timing cycle if the 'END IF READY' (EIR) input evaluates true. The user has the option of either entering a set of boolean equations to establish the behavior of the conditional qualifiers or directly enter data into a truth table.

Figure 2:
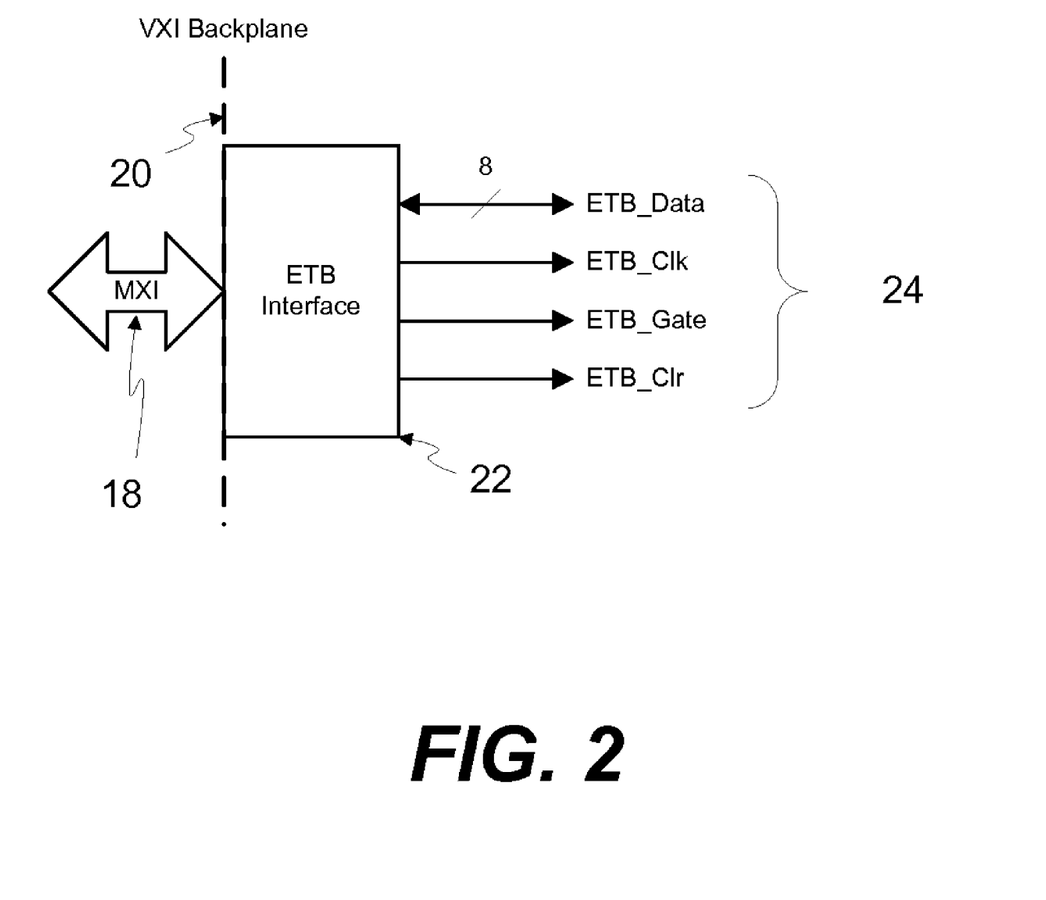
FIG. 2 represents a simplified block diagram of a VXI-ET (VME eXtensions for Instrumentation-Embertrace) sub-module wherein a Multisystem eXtension Interface (MXI) interface within the VXI chassis is transformed into a proprietary Embertrace (ET) bus that is used to interface with board level field programmable gate arrays (FPGAs).

Referring back to FIG. 1, MXI data 18 passes through a backplane 20 of the VXI module 12. The MXI data 18 is transformed by the VXI-ET interface 22 into a proprietary ET bus ("ETB") architecture, proprietary to the current assignee Advanced Testing Technologies, Inc., and thus the VXI-ET interface 22 is also referred to as an ETB interface as shown in FIG. 2. The ETB architecture 24 utilizes eight (8) parallel data lines ("ETB_Data" in FIG. 2), clock signals ("ETB_Clk"), gate signals ("ETB_Gate") and clear signals ("ETB_Clr") as a means for distributing data within the VXI module 12, i.e., to other modules and sub-modules in the VXI module 12 such as the pattern sub-module. The eight parallel data lines, ETB_Data, are bi-directional. This specific transformation of MXI data 18 through the VXI-ET interface 22 is a preferred transformation of the MXI data 18 and does not limit the invention and other data transformation techniques may be used in accordance with the invention. The MXI data originates from a generic controller This data output from the VXI-ET interface 22 is time-domain multiplexed into nine (9) words each constituting a 24-bit address, 32-bit data along with header and functional group data. This data is sent out to all FPGA devices within the VXI module 12 for decoding and processing within the appropriate device, e.g., the timing sub-module 14 and pattern sub-module 16 shown in FIG. 1 and more particularly to a sequence controller 26, timing cycle RAM 28 and a timing generator 30 shown in FIG. 4.

Figure 3:
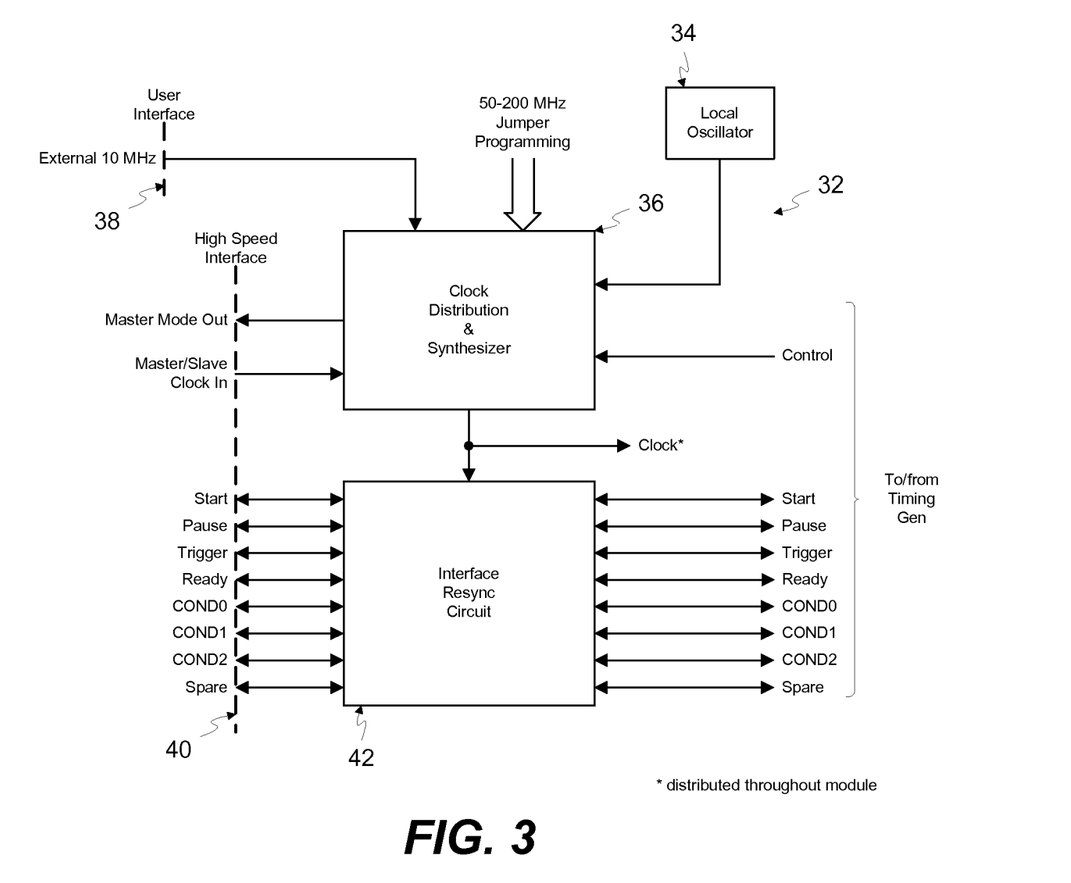
FIG. 3 represents a simplified block diagram of a master oscillator sub-module and interface resync sub-module and how they interface with other sub-modules.

The digital functional test system 10 uses synchronous architecture having three clock domains throughout the VXI module 12: the System clock, the Response clock and the Stimulus clock. The System clock is responsible for the generation of the other two clocks in the timing sub-module 14 and for RAM communication functions in the pattern sub-module 16. The Response and Stimulus clocks are responsible for propagating response and stimulus data in and out of the pattern sub-module 16. The System clock is generated in a master oscillator sub-module 32 that includes a master system oscillator. Thus, the master oscillator sub-module 32 may include a local oscillator 34 and a clock distribution and synthesizer 36 as shown in FIG. 3. The master system oscillator can be command-programmed to about 160 MHz or about 200 MHz or jumper-programmed to other frequencies with a range of, for example, about 50 MHz to about 200 MHz (see "50-200 MHz Jumper Programming" leading to the clock distribution and synthesizer 36 in FIG. 3). Typically, there is an external 10 MHz reference to the master system oscillator input via a user interface 38 (see "10 MHz reference" to the master oscillator sub-module 32 in FIG. 1 and "External 10 MHz" to the clock distribution and synthesizer 36 in FIG. 3). A control signal from the timing generator 30 is also input to the clock distribution and synthesizer 36.

Each physical module contains a master system oscillator which can be used to clock data within the system. At least three clock modes are possible via the master oscillator sub-module 32: local, slave and master.

In the local clock mode, the internal master oscillator is used as the clock within the VXI module 12. In the slave clock mode, the internal master oscillator is not used and the clock is obtained from a high speed bus via a high speed interface 40 (see "Clk In" to the master oscillator sub-module 32 in FIG. 1 and "Master/Slave Clock In" to the clock distribution and synthesizer 36 in FIG. 3). In the master clock mode, the internal master oscillator sources the high speed bus which then returns a buffered version of the clock for use within the VXI module 12 (see "Master Mode Out" from the master oscillator sub-module 32 and clock distribution and synthesizer 36 in FIGS. 1 and 3 respectively, "Clk In" to the master oscillator sub-module in FIG. 1 and "Master/Slave Clock In" to the clock distribution and synthesizer 36 in FIG. 3).

Figure 6:
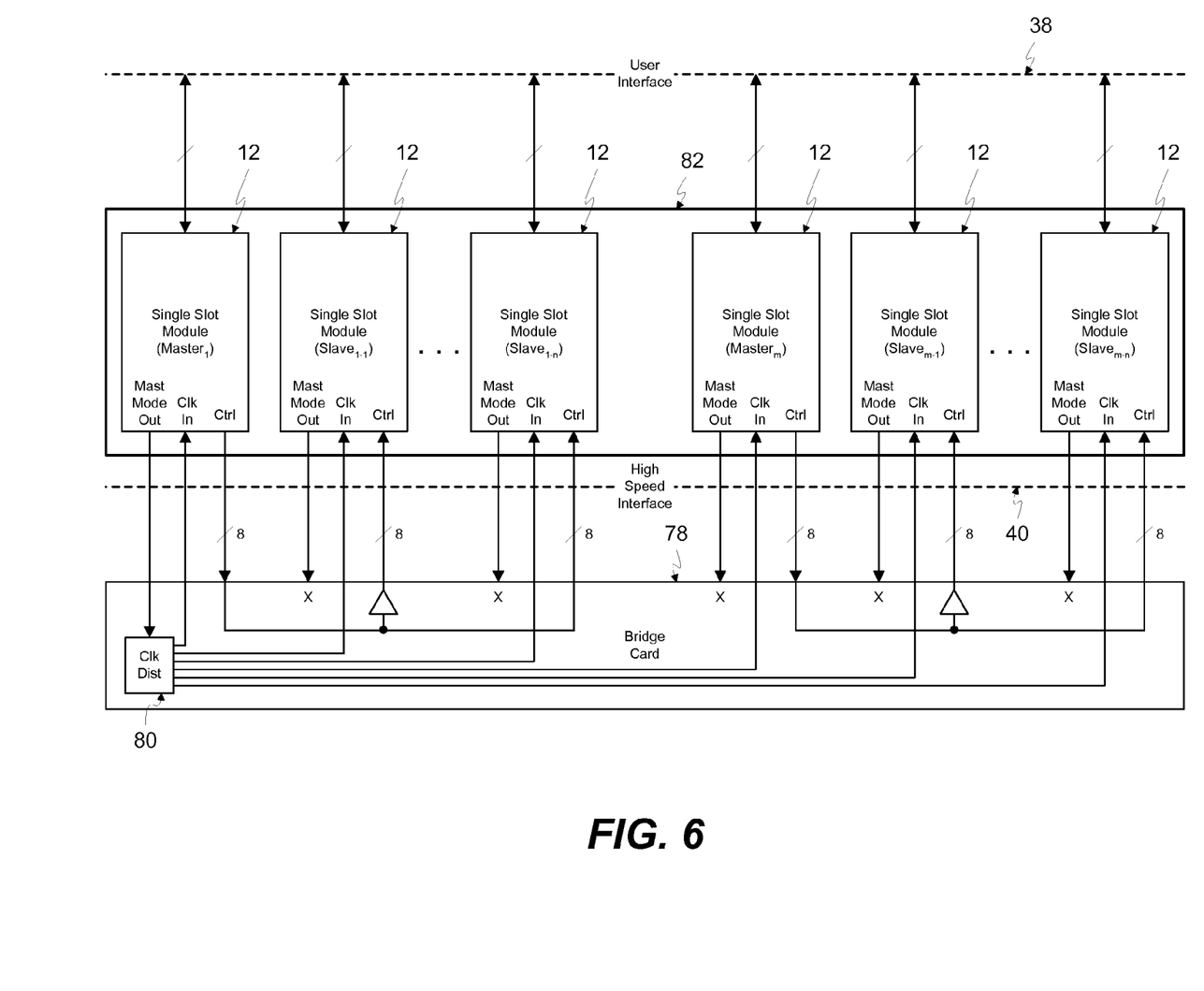
FIG. 6 represents a simplified block diagram of how multiple single slot modules would be synchronized using a bridge circuit card.

Synchronization of modules when more than one is present is accomplished via a "bridge card" 78 connected to the high-speed bus as shown in FIG. 6. The bridge card 78 utilizes differential low-voltage positive emitter-coupled logic (LVPECL) driver/receiver circuits along with a single clock distribution circuit 80 for buffering all of the clock(s) of the designated master module(s). The clock distribution circuit 80 receives the Master Mode Out signal from the master oscillator sub-module 32 of the associated master single slot module (Master') and provides the "Clk In" signal to this single slot module and all of the slave single slot modules associated with that master, i.e., single slot module(Slave$_{1\text{-}1}$") through single slot module(Slave"$_{1\text{-}n}$) and single slot module (Slave$_m$) through single slot module(Slave$_{m\text{-}n}$). The bridge card 78 with an interface re-sync circuit or sub-module 42, described below, together provide a synchronous pipeline to eliminate any skew issues within the system. FIG. 6 also shows a chassis 82 of the system 10, schematically, housing the plurality of single width modules 12 and which provides the VXI backplane 20.

Edge accurate techniques may be employed to control clock skew between modules. To this end, the master module is preferably centrally located between all single slot modules to insure that the signal with the longest trace length arrives at the associated module before the rising edge of the clock. Trace lengths on the bridge card 78 may therefore be all matched on the clock distribution portion thereof to insure all single slot modules are clocked with minimal skew relative to each other.

Referring back to FIG. 3, the interface re-sync circuit or sub-module 42 is provided with a clock signal from the clock distribution and synthesizer 36 and has a number of critical control signals. These critical signals include: Start or Run Pulse, Trigger, Ready, Pause and Conditions (0-2), i.e., COND0, COND1 and COND2, which are sourced by the designated master module(s) via the high speed interface 40, buffered on the bridge card 78 and re-distributed for timing purposes by all modules controlled by the particular master. That is, the critical signals may be received from and provided to the timing sub-module 14 shown in FIG. 1, and more particularly to the timing generator 30 shown in FIG. 4. The clock distribution circuit 80 on the bridge card 78 is phase-matched to insure that the positive edge of the master clock arrives within a 100 ps window to all modules. The other signals must arrive at each module within one clock period. A spare signal is also available if needed.

Figure 4:
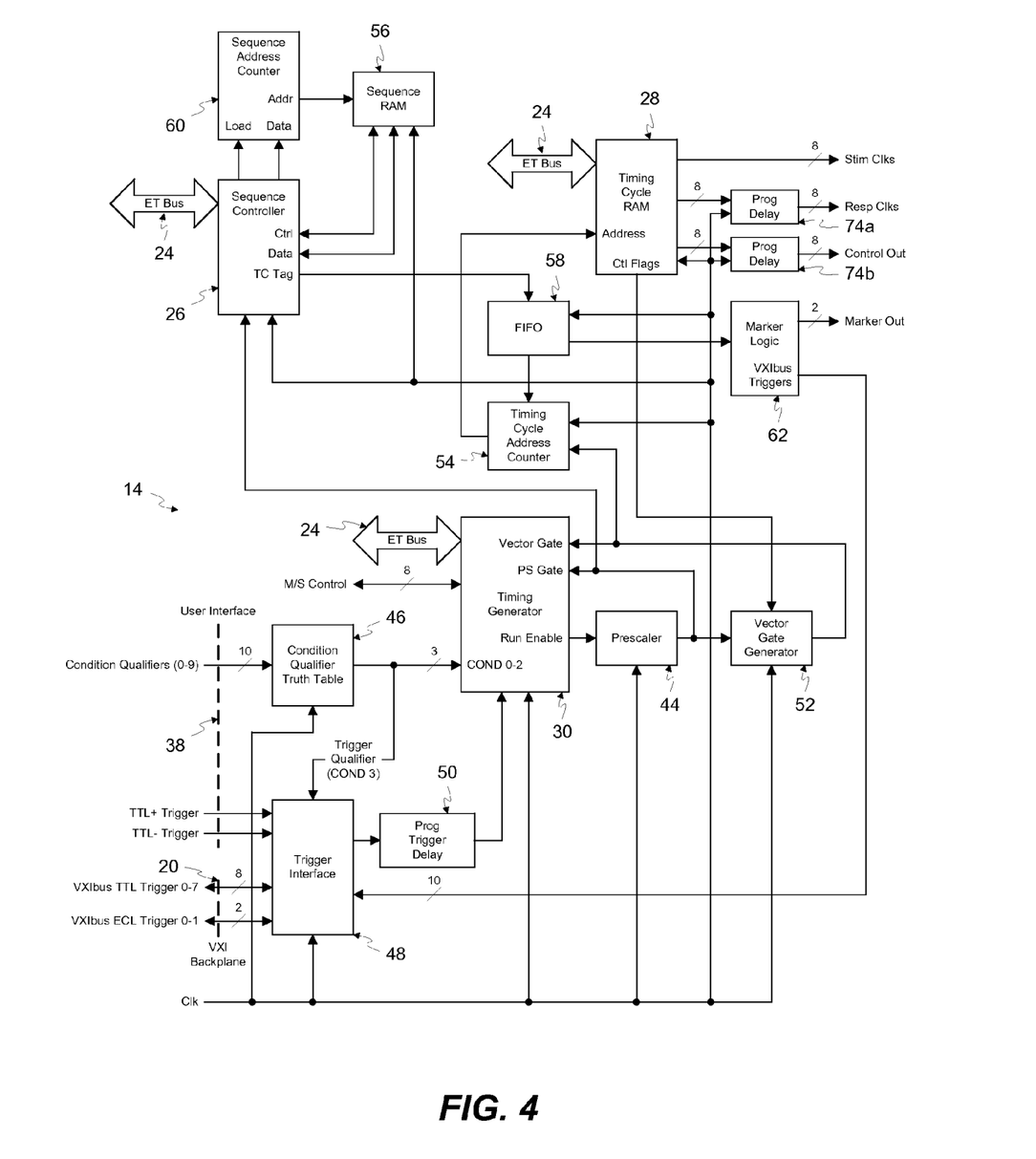
FIG. 4 represents a simplified block diagram of a timing sub-module and how it interfaces with other sub-modules.

Referring now to FIG. 4, the components of the timing sub-module 14 that generate the stimulus clocks ("Stim Clks" in the upper right), response clocks ("Resp Clks"), control outputs ("Control Out") and marker data ("Marker Out") within each single width module are shown. Programmable delay elements 74a (associated with the response clocks) and 74b (associated with the control out port) are used to account for system delays such as those resulting from system cabling. These elements have a capacity of four (4) bits (16 states) and operate at the master clock frequency. A prescaler 44, preferably with a minimum capacity of 24 bits (16M [16,777,216]), allows the period of the sub-cycle resolution to be scaled within a range of about 5 nS to about 83.886 mS (based on a master system oscillator frequency of about 200 MHz). The output of the prescaler 44 is input to "PS Gate" of the timing generator 30.

The M/S control signals present on the timing generator 30 in FIG. 4 connect with the interface resync circuit or sub-module 42 shown in FIG. 3. The test system can be set up to use Boolean expression evaluators in conjunction with no less than 10 conditional qualifier inputs which are available at the user interface 38. These evaluators form a truth table, i.e., condition qualifier truth table 46, that is capable of generating a minimum of four (4) conditional output states used for operational control, e.g., COND0, COND1, COND2 and COND3. The last of the conditional outputs, COND3, can serve as a trigger qualifier within the triggering portion of the digital functional test system 10. The trigger qualifier is provided to the trigger interface portion 48, while the other three conditional qualifiers, COND0, COND1 and COND2, are provided to the timing generator 30.

The trigger interface portion 48 of the timing sub-module 14 supports triggering from a variety of sources and can be specified relative to a positive or negative signal slope. Triggering of the digital functional test system 10 can be effected by any of the eight (8) transistor-transistor logic (TTL) triggers ("VXIbus TTL Trigger 0-7") or two (2) emitter coupled logic (ECL) triggers ("VXIbus ECL Trigger 0-1") present on the VXI backplane 20. Discrete inverting and non-inverting TTL triggers at the module level, i.e., "TTL+ trigger" and "TTL– trigger", are provided as well.

A variable trigger delay can be utilized to delay actual triggering of the digital functional test system 10 by up to 64K (65,535) counts of the master system oscillator 32 via a 16 bit counter that is clocked by the master system oscillator 32. This variable trigger delay may be implemented via programmable trigger delay 50 interposed between the trigger interface portion 48 and the timing generator 30.

System triggering is defined at the sequence level by 'arming' any or all vectors in a given sequence. If an 'armed' vector is encountered during execution of a sequence, all operations of the timing sub-module 14 stop and enter a 'waiting for trigger' state. In the 'waiting for trigger' state, the pattern data on ports for which a clock has been defined (either stimulus and/or response) is frozen until a trigger is encountered. Once the trigger has been satisfied, sequence operation continues as normal until another armed vector is encountered. Any modules that are slaved together, share the trigger from the master module (via the bridge card 78) unless one of the slave cards is commanded to switch to its local trigger.

The timing generator 30 directly interfaces with the ET bus for loading of data. The timing generator 30 interacts with a bank 28 of Random Access Memory (RAM) which is used to store timing cycle data within a particular sequence or set of sequences. Preferably, a minimum RAM depth of 16K (16, 384 locations)×32 bits wide insures ample space for defining pattern module clocks, control outputs as well as various flags needed during operation of the system.

The timing cycle RAM 28 also directly interfaces with the ET bus 24 to facilitate loading of timing cycle data. Operational control of timing cycle data is through the use of a vector gate signal generated by a vector gate generator 52, input to the timing generator 30 via "Vector Gate", and a timing cycle address counter 54, see FIG. 4. The vector gate signal is used to instruct the timing cycle address counter 54 to increment which loads the next vector within a sequence. Separate stimulus and response pattern clock data required by each pin group (and associated pattern sub-module ports) are contained within the timing cycle RAM 28. Data for the eight (8) bit port of control outputs is also contained within the timing cycle RAM 28 and is used to toggle the appropriate lines at the designated sub-cycle intervals as part of each timing cycle definition. The speed of the eight (8) bit control output port may be limited to 100 MHz (10 nS per pattern). In the event the sub-cycle resolution is specified smaller than 10 nS, the pattern change is limited to change every other sub-cycle instead of every sub-cycle. A pattern clock for a pin group can also be defined as a 'hold' in which case the contents of the associated pin group remain statically set throughout execution of the sequence and do not actively participate.

The sequence controller 26 directly interfaces with the ET bus 24 for loading of sequence data. The sequence controller 26 interacts with a bank 56 of Random Access Memory (RAM) which is used to store sequence data. This data consists of timing cycle tags (address locations) and trigger arm flags which are processed by the sequence controller 26 and directed to and interfaced with a First-In, First-Out (FIFO) queue 58, see "TC tag" output from the sequence controller 26. The FIFO queue 58 operates as an elastic buffer to insure sequence data neither overflows nor underflows. Data is loaded in the FIFO 58 until a control flag indicating the FIFO 58 is nearing capacity is asserted. At this point, the loading of data into the FIFO 58 ceases and data from the FIFO 58 is gradually processed. As the data in the FIFO 58 is exhausted, a control flag indicating the FIFO 58 is nearing an empty state is asserted and the process repeats. The FIFO 58 is used to mitigate clock latency that would otherwise be encountered if accessed directly. This FIFO 58 in turn feeds the timing cycle address counter 54.

The sequence controller 26 is used to load and manage the timing tags that feed the timing generator 30. A minimum depth of 1 M (1,048,576 locations)×18 bits wide insures ample space for defining sequence data along with timing cycle tags that feed the FIFO 58 controlling the timing cycle address counter 54. The sequence RAM 56 is indexed by a sequence address counter 60. The architecture of the sequence controller 26 permits any sequence to be run through a fixed number of iterations (1 to 16,777,215[24 bits]) or looped indefinitely through control of the sequence address counter 60.

The timing cycle tag data fed into the FIFO 58 also sources the marker outputs via a marker logic component 62, see the output from the timing sub-module 14 in FIG. 1. 'Marker Hi' and 'Marker Lo' output signals complement the eight (8) control output signals available at the user interface 38 for supporting complex DUTs. In addition to the marker and control outputs, the TTL and ECL VXIbus trigger outputs are available to assist in complex system triggered tasks.

Figure 5:
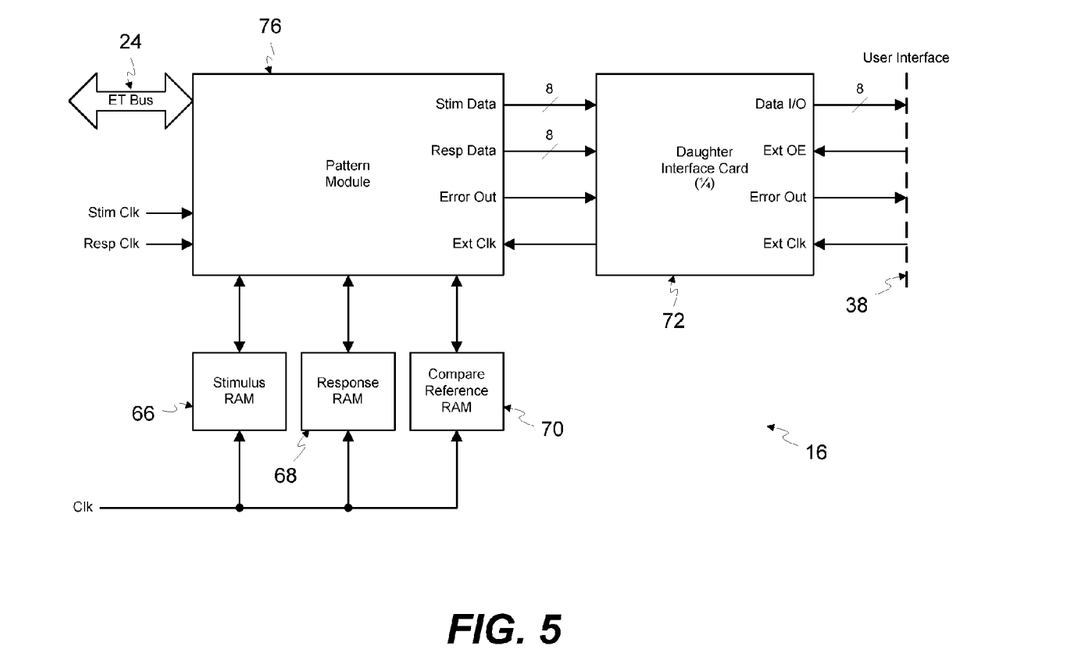
FIG. 5 represents a simplified block diagram of a pattern sub-module and how it interfaces with other sub-modules and a DUT via a user interface.

The pattern sub-module 16 forms the basis for a single eight (8) bit bi-directional port used for I/O at the user interface 38. A minimum of eight (8) pattern sub-modules are implemented within the physical module, but the actual quantity is not intended to limit the scope of the invention. The architecture is typically limited by physical board space and available space for providing connectorized I/O on the front panel.

Separate stimulus and response (record/compare) interfaces are implemented within each of the eight (8) bit pattern sub-modules 16. These interfaces are clocked independently in each pattern sub-module 16, see inputs to the pattern module 76 "Stim Clk" and "Resp Clk" in FIG. 5 (which depicts an exemplifying interior of the pattern sub-module 16 shown in FIG. 1). The relative timing of the stimulus and response clocks is defined within the timing cycle definition which independently specify which sub-cycle the stimulus and response clocks occur at. In order to manage the skew within the overall system, each of these clocks also utilizes a clock de-skew circuit 64 for every pattern sub-module 16, see FIG. 1. The de-skew circuit 64 is calibrated at the factory and its setting stored in a programmable read only memory (PROM).

Referring further to FIG. 5, an eight (8) bit pattern module 76 is designed to interface bi-directionally with three (3) independent banks of RAM. One bank of RAM is used for outgoing stimulus data (stimulus RAM 66), a second bank of RAM is used for recording incoming response data (response RAM 68) and the last bank of RAM is used as reference for the compare function of the recorded response data (compare reference RAM 70). The various RAM components 66, 68, 70 are used to store the data that represents each vector of pin group pattern data used within a particular sequence or set of sequences. A minimum depth of 1M (1,048,576 locations)× 18 bits wide insures ample space for defining pattern data along with tags to identify boundaries and control flags needed during operation of the test system. All of the RAM components 66, 68, 70 receive clock signals from the master system oscillator 32.

Important advantages of the invention arise from the presence of the separate RAM components 66, 68, 70. For example, for each data channel, i.e., up to 8 ports of data being processed by the single slot module, it is possible to use all of the RAM components 66, 68, 70 simultaneously. That is, at the same time, the stimulus RAM 66 is processing stimulus data, the response RAM 68 is recording incoming response data (and can also be referred to as a record RAM) and the compare reference RAM 70 is conducting a vector-by-vector comparison to the reference. This simultaneous performance of processing of stimulus data, recording of incoming response data and comparison of data to a reference could not be performed for each channel by the HP/Agilent D20 described above wherein three separate ports were typically needed to process such data, i.e., one for the processing of stimulus data, another for the recording of incoming response data and yet another for the comparison of data to a reference.

Incoming/outgoing pattern data at the user interface 38, i.e., stimulus data ("Stim Data" in FIG. 5) and response data ("Resp Data"), passes through a replaceable daughter card before being processed internally, i.e., daughter interface card 72 in FIG. 5. The daughter card 72 is intended to be the sacrificial element within the system in the event of overload, short or other anomaly at the user interface 38. The use of a daughter card 72 also allows the user interface 38 to be tailored to a user's needs. Further, TTL, ECL, high voltage, user programmable and/or other electrical interfaces can be implemented within the daughter card 72 without necessitating re-design of the rest of the module. The daughter card 72 also preferably contains the PROMs used to calibrate the pattern sub-module de-skew circuitry 64.

Currently, one daughter card 72 is capable of supporting four (4) pattern modules 76 although this is not intended to limit the scope of the invention.

As mentioned above, digital functional test system 10 would typically be implemented using a modular architecture such as the VXI platform, but the physical implementation does not limit the scope of the invention as it may be adapted to other modular platforms. The digital functional test system 10 is capable of operating in either a static or dynamic mode of operation. In the static mode of operation, a stimulus pattern can be written to and/or response pattern read from a DUT on an as-needed basis. In the dynamic mode of operation, stimulus, response and compare functions may be implemented in a sequential fashion and executed within a timing framework as laid out by the test designer.

The digital functional test system 10 is preferably implemented using a high speed communications control bus such as the register-based MXI, but the communication link does not limit the scope of the invention as it may be adapted to other communication links. An optional software-based parser interface may be implemented to support legacy-based SCPI message commands. Two common methods for uploading SCPI data include individual software based library calls and an ASCII-based text file which is parsed line-by-line. The digital functional test system 10 will support both common message based formats while also supporting high-speed register based data transfer.

This digital functional test system 10 is intended to serve as a functional replacement of the HP/Agilent D20 System with respect to software command set and input/output (I/O) signals while providing additional functionality in a smaller package. The use of an intermediate SCPI parser achieves command compatibility that approaches 100% with existing program files while also allowing high speed register programming. A modernized design based around field programmable gate arrays (FPGA) adds the following additional capabilities and functions while maintaining/expanding the original signal I/O:

Increased operation from 20 MHz to about 50 MHz;

Increased sequence depth from 64K to about 1 Meg vectors;

Enhanced sub-cycle resolution from about 6.25 nS to about 5 nS;

Increased sub-cycle pool from 1K to about 16K cycles;

Changed fixed 160 MHz master clock to programmable within a range of about 50 MHz to about 200 MHz;

Fixed internal 160 MHz timebase is selectable between precision 1 ppm temperature controlled crystal oscillator (TCXO) or external 10 MHz source;

Unsupported looping operation can be specified for 1 to 16 Meg iterations or looped indefinitely;

Separate timing module eliminated and equivalent function (with associated support I/O) included in each single width module;

Each single width module I/O count increased from 32 pins to 64 pins;

Unidirectional pins are bi-directional through implementation of separate stimulus memory with direction control;

Overall pass/fail compare function can be queried on a vector basis through implementation of separate record and compare memories which provide concurrent operation;

Fixed response pattern mask is definable on a vector basis;

Fixed TTL I/O pins are voltage programmable; and

Added user accessible first error pulse pin which corresponds to the first mismatch in a sequence.

Moreover, the use of FPGAs at the pattern sub-modules 16 provides unique flexibility in the way the data is handled. The basic configuration allows for straight parallel one-for-one data input and output. The pattern sub-module 16 could also be reconfigured for other data formats, such as serial data when used in conjunction with clock and enable/gate signals. More specialized applications, such as a pseudorandom binary sequence (PRBS) generator, could easily be implemented to produce lengthy repetitive patterns without having to manually generate the series of vectors required for operation.

Since FPGAs are typically loaded via a configuration device (memory), the manner in which the pattern sub-modules 16 interact with the user interface 38 can be changed on-the-fly by downloading a new FPGA configuration to memory. This allows maximum use of the field programmable capabilities of the FPGA devices and permits the user to change to way the invention operates via simple download.

The current usable pattern rate of the overall system is approximately 50 MHz although internal clock frequencies operate higher due to oversampling and clock latencies. Other clock schemes and architectures could be implemented to extend the usable operating frequency beyond this limit and is not intended to limit the scope of the invention.

Figure 7:
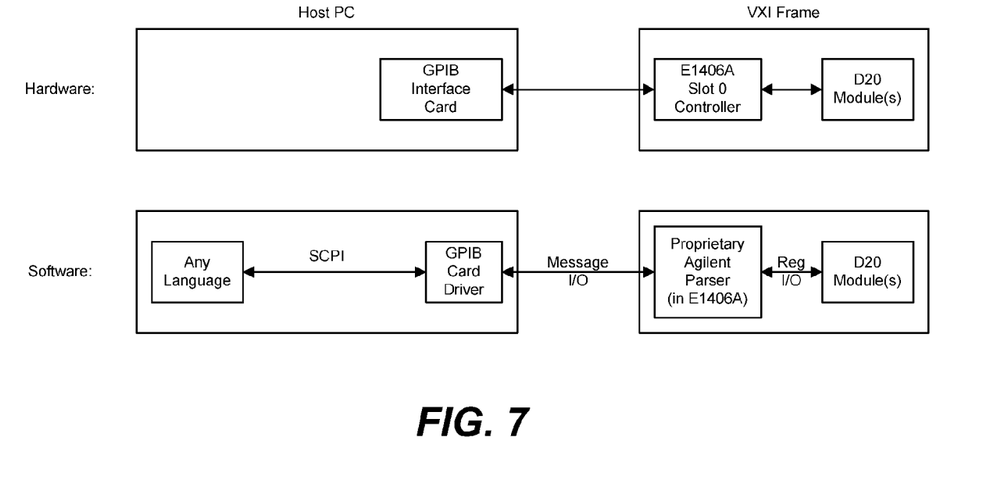
FIG. 7 is a schematic of basic hardware and software of a prior art HP/Agilent Technology Model D20 Digital Functional Test System.

As shown in FIG. 7, the prior art, legacy HP/Agilent Technology Model D20 Digital Functional Test System including one or more D20 modules requires a specific GPIB-VXI Slot 0 controller (E1406A) to permit use of message-based SCPI commands that originated from the host PC and are provided to the E1406A through a GPIB interface card (the hardware components). This imposes a restriction on the use of the D20 digital functional test system which can be avoided in the present claimed invention. With respect to the software, the message-based commands, originating in any language, were transacted across the GPIB interface using the GPIB card driver, and translated to register-based control through the use of an embedded, proprietary SCPI parser resident within the memory of the E1406A.

Figure 8:
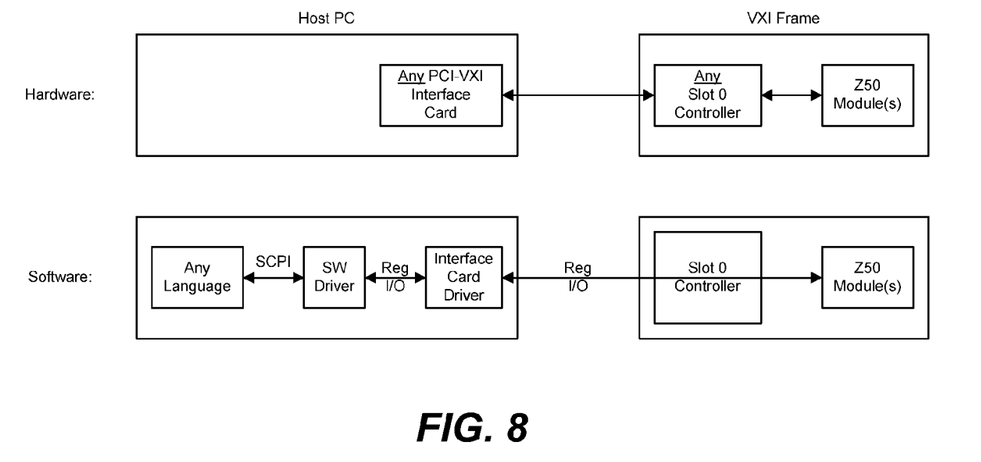
FIG. 8 is a schematic of basic hardware and software of a digital functional test system in accordance with the invention.

By contrast, as shown in FIG. 8, in the present invention, the SCPI parser is located on the host PC in any PCI-VXI interface card which allows the use of any slot 0 controller (GPIB and MXI variants) on the VXI frame that controls one or more Z50 modules provided on the VXI frame. This is enabled by using register-based commands across the PC to VXI interface. In this approach, the native register commands in any language are transparent to the slot 0 controller and do not require the use of a specific controller for operation. There is thus no limitation on which controller may be used, as is present in the HP/Agilent D20 system. The commands are converted by the software driver SW driver to regular input/output (I/O) commands and directed to the Z50 module(s) via the interface card driver and slot 0 controller.

Accordingly, a significant advantage of the invention over the D20 system is that instead of having a command module on the VXI frame that parses messages into digital registers for the timing module, the invention parses messages apart from the VXI frame and command module, i.e., the message parsing is performed on the host computer.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention. Indeed, it is envisioned that any feature shown in or described in connection with one embodiment may be applied to any of the other embodiments shown or described herein to the extent not inconsistent with a particular feature of that embodiment.

What is claimed is:

1. A digital functional test system, comprising:
   a chassis; and
   a first single width VME eXtensions for Instrumentation (VXI) module arranged in or on said chassis,
   said first single width VXI module including:
   a timing sub-module that generates a stimulus clock signal and a response clock signal;
   at least eight pattern sub-modules; and
   a master oscillator sub-module that provides a clock signal,
   each of said pattern sub-modules receiving the stimulus clock signal and the response clock signal from said timing sub-module, and the clock signal from said master oscillator sub-module,
   each of said pattern sub-modules including a pattern generating module, a stimulus memory component that stores stimulus data outgoing from said pattern generating module, a response memory component that records response data incoming to said pattern generating module, and a compare reference memory component that provides a reference for a compare function of the recorded response data in said response memory component.

2. The system of claim 1, wherein said stimulus memory component, said response memory component and said compare reference memory component each comprise a bank of random access memory.

3. The system of claim 1, wherein said stimulus memory component, said response memory component and said compare reference memory component are separate memory components.

4. The system of claim 1, wherein said stimulus memory component, said response memory component and said compare reference memory component are configured to enable simultaneous reading of data from or writing of data to all of said memory components.

5. The system of claim 1, wherein each of said stimulus memory component, said response memory component and said compare reference memory component receive the clock signal from said master oscillator sub-module and are interposed in a signal path between said master oscillator sub-module and said pattern generating module.

6. The system of claim 1, wherein each of said pattern sub-modules includes digital elements within a field programmable gate array.

7. The system of claim 1, wherein said first single width VXI module includes a VME eXtensions for Instrumentation-Ember Trace (VXI-ET) interface that converts Multisystem Extension Interface (MXI) data into Ember-Trace (ET) bus architecture that is processed by said timing sub-module and said pattern sub-modules of said first single width VXI module.

8. A digital functional test system, comprising:
a chassis;
single width VME eXtensions for Instrumentation (VXI) modules arranged in or on said chassis, each of said single width VXI modules including a timing sub-module and at least eight pattern sub-modules;
interfaces interacting with said single width VXI modules, said interfaces including a high speed interface; and
a bridge card connected to said single width VXI modules via said high speed interface,
said bridge card being configured to receive a timing signal from a first one of said single width VXI modules and distribute a clock signal to a group of said single width VXI modules including said first single width VXI module to thereby enable said group of single width VXI modules to operate synchronously,
said bridge card being configured to employ a clock skew technique to ensure that signals to all of said single width VXI modules in said group of single width VXI modules arrive before a rising edge of the clock signal.

9. The system of claim 8, wherein said bridge card is further configured to provide a substantially equal length of a trace conductor from a clock distribution circuit on said bridge card to outlets of said bridge card, each of the outlets being connected to a clock-in port of a respective one of said single slot width VXI modules in said group of single width VXI modules.

10. The system of claim 8, wherein said bridge card is further configured to convey control signals from said first single width VXI module to at least one other single width VXI modules in said group of single width VXI modules.

11. The system of claim 8, wherein all of said single width VXI modules have the same components.

12. The system of claim 8, wherein each of said pattern sub-modules includes digital elements within a field programmable gate array.

13. The system of claim 8, wherein each of said single width VXI modules includes a VME eXtensions for Instrumentation-Ember Trace (VXI-ET) interface that converts Multisystem Extension Interface (MXI) data into Ember-Trace (ET) bus architecture that is processed by said timing sub-module and said pattern sub-modules of said single width VXI module.

14. The system of claim 8, wherein each of said single width VXI modules further includes an interface re-sync circuit that provides control signals to a clock distribution circuit on said bridge card.

15. A digital functional test system, comprising:
a chassis;
a first single width VME eXtensions for Instrumentation (VXI) module arranged in or on said chassis, said first single width VXI module including a timing sub-module and at least eight pattern sub-modules;
interfaces interacting with said first single width VXI module, said interfaces including a high speed interface; and
a VME eXtensions for Instrumentation-Ember Trace (VXI-ET) interface that converts Multisystem Extension Interface (MXI) data into Ember-Trace (ET) bus architecture that is processed by said timing sub-module and said pattern sub-modules,
said timing sub-module being configured to generate timing signals and comprising:
a timing generator coupled to said VXI-ET interface;
a sequence controller coupled to said VXI-ET interface and receiving timing signals from said timing generator;
a timing cycle address counter; and
a First-In, First-Out (FIFO) queue interposed in a signal path between said sequence controller and said timing cycle address counter and configured to operate as an elastic buffer for data from said sequence controller to said timing cycle address counter.

16. The system of claim 15, wherein said sequence controller provides timing data to the FIFO queue until a first control flag indicating the FIFO queue is nearing capacity is asserted and then loading of data into the FIFO queue ceases and data from the FIFO queue is gradually processed by said timing cycle address counter, and wherein when data in the FIFO queue is exhausted, a second control flag is asserted and said sequence controller then provides additional timing data to the FIFO queue.

17. The system of claim 15, wherein said sequence controller loads and manages timing tags that feed said timing generator.

18. The system of claim 15, wherein said sequence controller is configured to sequence data and timing cycle tags that feed the FIFO queue.

19. The system of claim 18, further comprising a marker logic component sourced by the FIFO queue, the FIFO queue being configured such that timing cycle tag data fed into the FIFO queue is a source for marker outputs via said marker logic component.

20. The system of claim 15, further comprising timing cycle RAM coupled to said VXI-ET interface and to said timing cycle address counter, said timing cycle RAM being configured to store the timing signals to be output from said single width VXI module.

21. The system of claim 1, further comprising at least one additional single width VXI module arranged in or on said chassis, said at least one additional single width VXI module including the same structure as said first single width VXI module.

22. The system of claim 1, further comprising a plurality of additional single width VXI modules arranged in or on said chassis, each of said additional single width VXI modules including the same structure as said first single width VXI module.

23. The system of claim 1, wherein each of said pattern sub-modules includes eight bi-directional input/output pins.

24. The system of claim 8, wherein each of said pattern sub-modules includes eight bi-directional input/output pins.

25. The system of claim 15, further comprising at least one additional single width VXI module arranged in or on said chassis, said at least one additional single width VXI module including the same structure as said first single width VXI module.

26. The system of claim 15, further comprising a plurality of additional single width VXI modules arranged in or on said chassis, each of said additional single width VXI modules including the same structure as said first single width VXI module.

27. The system of claim 15, wherein each of said pattern sub-modules includes eight bi-directional input/output pins.

* * * * *

UNITED STATES PATENT AND TRADEMARK OFFICE
CERTIFICATE OF CORRECTION

| | |
|---|---|
| PATENT NO. | : 8,359,504 B1 |
| APPLICATION NO. | : 12/781888 |
| DATED | : January 22, 2013 |
| INVENTOR(S) | : Marc Pogosky, Richard Engel and Eli Levi |

It is certified that error appears in the above-identified patent and that said Letters Patent is hereby corrected as shown below:

Column 13, line 53, after "single", first instance, delete "slot".

Signed and Sealed this
Twenty-sixth Day of February, 2013

Teresa Stanek Rea
*Acting Director of the United States Patent and Trademark Office*